United States Patent [19]

Davenport

[11] 4,362,955
[45] Dec. 7, 1982

[54] CURRENT BOOST CIRCUIT FOR A PULSE GENERATOR OUTPUT STAGE

[75] Inventor: William H. Davenport, Hillsboro, Oreg.

[73] Assignee: Tektronix, Inc., Beaverton, Oreg.

[21] Appl. No.: 217,954

[22] Filed: Dec. 18, 1980

[51] Int. Cl.³ .............................................. H03K 5/12
[52] U.S. Cl. .................................... 307/263; 307/264; 307/268
[58] Field of Search ............... 307/264, 268, 263, 551, 307/559, 561; 328/60, 61

[56] References Cited

U.S. PATENT DOCUMENTS

| | | | |
|---|---|---|---|
| 3,125,694 | 3/1964 | Palthe | 307/263 |
| 3,448,300 | 6/1969 | Gyugyi | 307/252 J |
| 3,470,391 | 9/1969 | Granger | 307/268 |

Primary Examiner—John Zazworsky
Attorney, Agent, or Firm—George T. Noe

[57] ABSTRACT

A pulse generator output stage is provided with a current boost circuit to generate additional current substantially contemporaneously with pulse transitions in order to achieve fast output risetimes and falltimes. Switched current generators are arranged to produce a square-wave current having current spikes on the rising and falling edges to rapidly charge and discharge inherent circuit capacitances and thereby produce square-wave voltage pulses with a minimum of power consumption.

3 Claims, 2 Drawing Figures

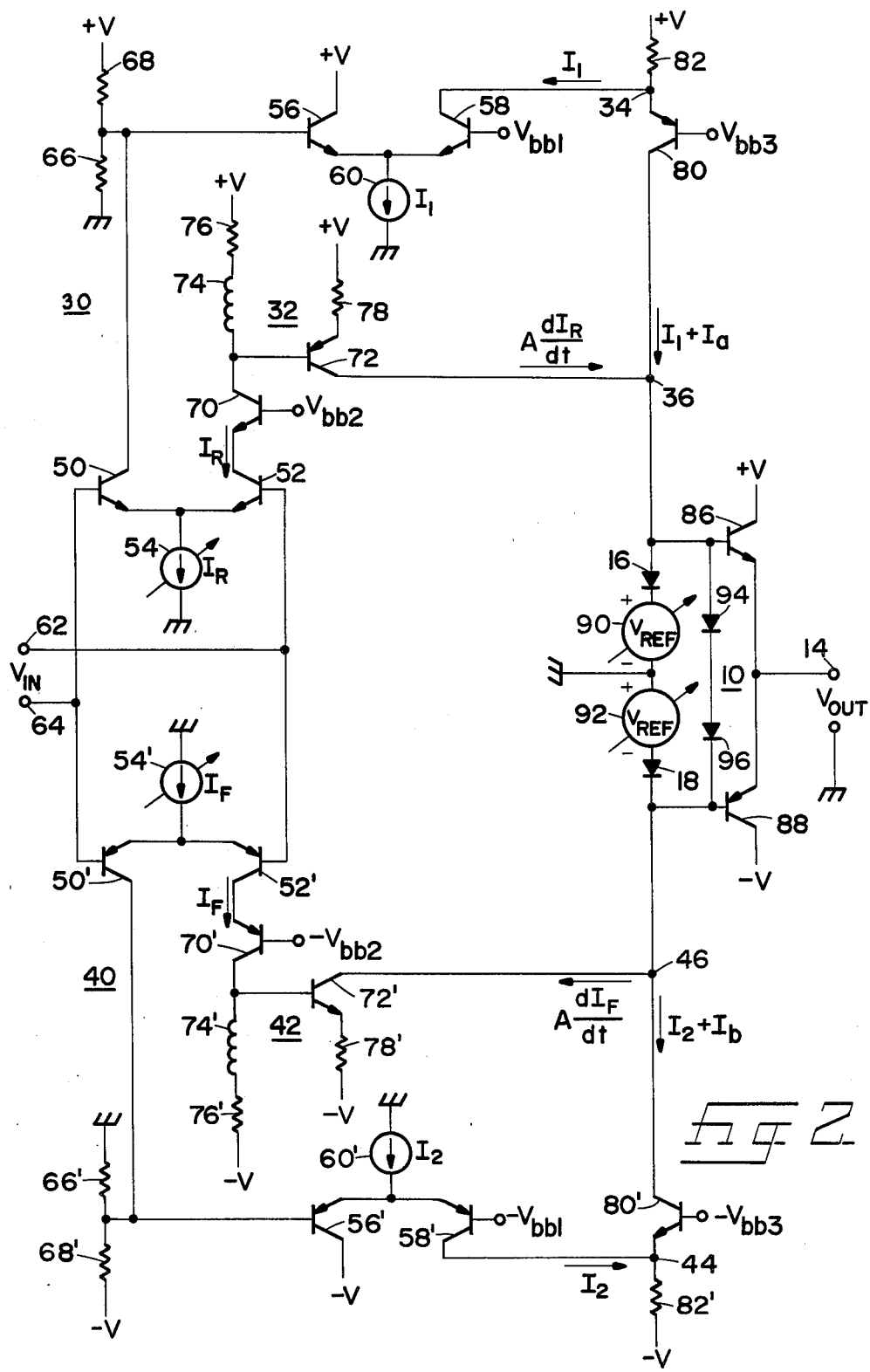

4,362,955

CURRENT BOOST CIRCUIT FOR A PULSE GENERATOR OUTPUT STAGE

BACKGROUND OF THE INVENTION

The present invention relates to pulse-forming networks in general, and in particular to a circuit for providing additional current during pulse transitions in order to achieve fast output risetimes and falltimes.

Pulse generators are used in a variety of circuit testing applications, and are therefore available as electronic test and measurement instruments which produce pulses having specified parameters that can be adjusted independently of one another. These parameters include pulse amplitude, pulse width, repetition rate, risetime and falltime. The active components (e.g., diodes and transistors) of the output stages of such pulses generators typically exhibit large capacitances which determine the slew rate of pulse transitions. To achieve fast output risetimes and falltimes of pulses, which may typically be in the sub-nano-second to a few nanoseconds range, the output stages have had to stand large amounts of current in order to drive these capacitances. While providing a solution to overcome the limiting effects of inherent capacitance on the risetimes and falltimes of output pulses, standing a large amount of current results in a large amount of wasted power which is manifested as heat.

SUMMARY OF THE INVENTION

In accordance with the present invention, a switched current generator circuit for a pulse generator complementary amplifier output stage permits low-power operation during substantially steady state portions of an output pulse and provides a momentary increase in current during the pulse transitions to drive the aforementioned inherent circuit capacitance and thereby achieve fast output risetimes and falltimes.

The circuit, which is driven by a low-voltage square-wave, is divided into a current source portion for developing the positive-going part of the output pulse and a current sink portion for developing the negative-going part of the output pulse. Each portion includes a current spike generator which is switched on to produce a differentiated current spike of an amplitude and duration required for a particular slew rate. The current spikes are added to contemporaneously-generated square-wave pulse level holding currents to switch the output between independently adjustable positive and negative reference voltages to thereby produce a pulse voltage output signal having a fast risetime and falltime.

It is therefore one object of the present invention to provide a current boost circuit for a pulse generator output stage for generating additional current substantially contemporaneously with pulse transitions in order to achieve fast output risetimes and falltimes.

It is another object of the present invention to provide a pulse generator output stage in which power consumption is minimized.

It is a further object of the present invention to provide a pulse generator output stage having split current paths which are summed together to provide an output driving current.

Other objects and attainments of the present invention will become apparent to those skilled in the art upon a reading of the following description when taken in conjunction with the drawings.

BRIEF DESCRIPTION OF THE DRAWINGS

FIG. 2 is a schematic diagram of a preferred embodiment of the present invention.

DETAILED DESCRIPTION OF THE INVENTION

Figure 1:
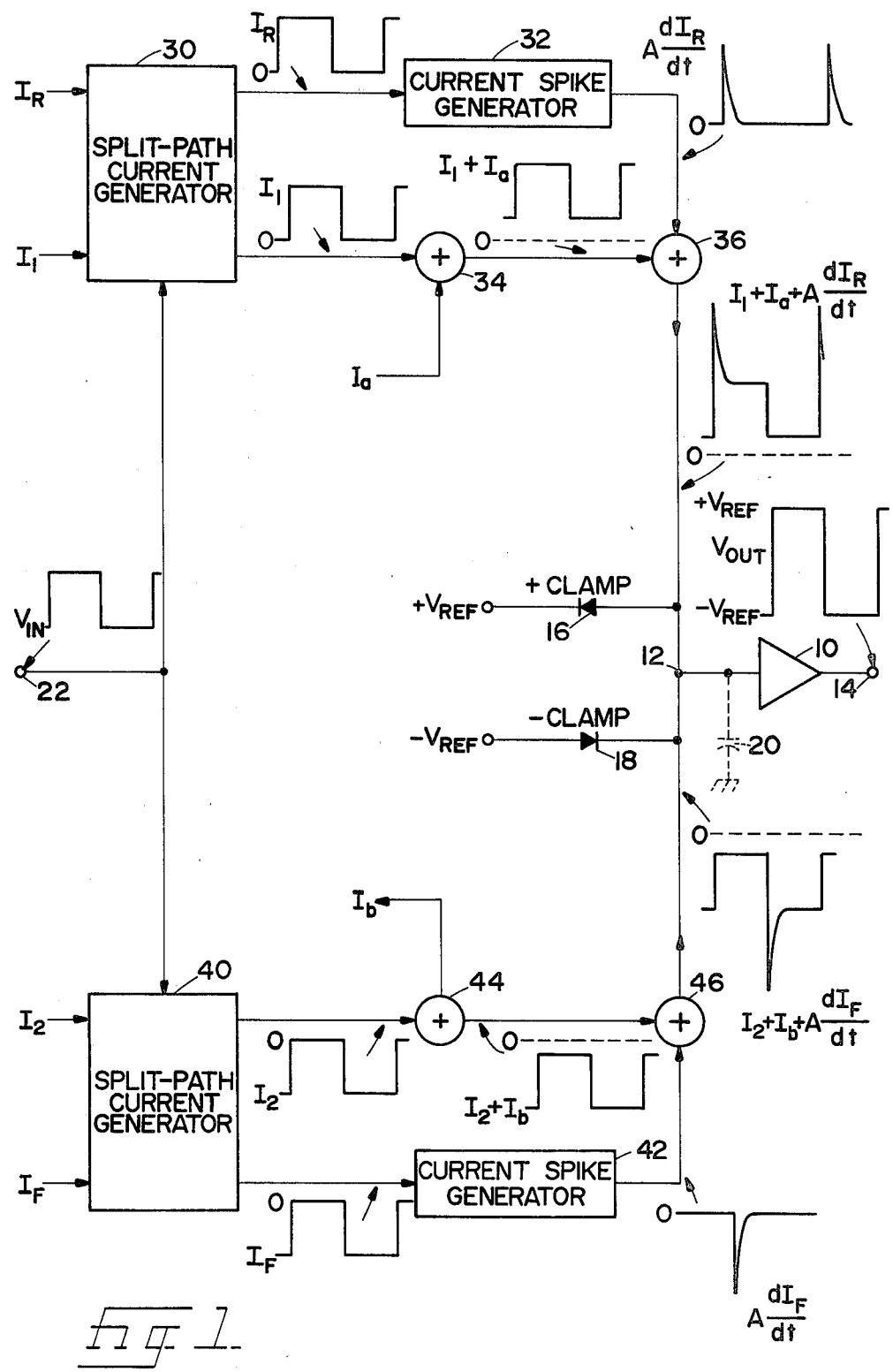
FIG. 1 is a block diagram of a pulse generator output stage in accordance with the present invention.

Referring to the block diagram of FIG. 1, a pulse generator output stage includes an output voltage follower 10 connected to a current-driven output node 12 to produce a voltage output signal $V_{OUT}$ at output terminal 14. A pair of oppositely-poled voltage clamps 16 and 18 are connected between the output node 12 and suitable adjustable reference voltages $+V_{REF}$ and $-V_{REF}$ respectively to establish the positive and negative limits of the output signal $V_{OUT}$. A capacitor 20, shown by dashed lines, represents the inherent capacitance to ground of the semiconductor devices connected to node 12, and this includes the inherent capacitance of the clamping diodes 16 and 18 as well as the base-to-collector transistor junctions of the output follower 10. Waveforms are shown in the block diagram at the various points at which they occur rather than as a separate illustration to facilitate an understanding of the present invention.

A low-voltage switching signal $V_{IN}$ applied to an input terminal 22 contains timing information for developing the output voltage signal $V_{OUT}$, and therefore may have any desired pulse repetition rate and duty cycle. A first current-generating circuit for developing the positive-going portion of the output pulse comprises a split-path current generator 30, a current spike generator 32, and a pair of current-summing nodes 34 and 36. A pair of currents $I_1$ and $I_R$ are applied to the split-path current generator 30, which is switched by the input signal $V_{IN}$ to produce the two parallel output current signals $I_R$ and $I_1$ in synchronization therewith. A small, fixed current $I_a$ is added to the current signal $I_1$ at summing node 34. The current signal $I_R$ is amplified and differentiated by the current spike generator to produce a large current spike at the leading edge of the $I_R$ signal. This current spike is added to the $I_1 + I_a$ signal at summing node 36, from which such current flows via node 12 into capacitor 20, causing the capacitor to change its state of charge. The large current spike developed by current spike generator 32 is actually a current-surge which causes the capacitor 20 to change its state of charge very rapidly as the voltage at node 12 moves in a positive direction, resulting in a fast rising edge of the output signal $V_{OUT}$. When the capacitor 20 charges to the pulse upper voltage level, $+V_{REF}$, the positive clamping diode 16 turns on and current from summing node 36 is diverted through the diode 16 to the storage of $+V_{REF}$ supply. After the current surges diminishes, the current $I_1 + I_a$ is sufficient to hold the output voltage level at $+V_{REF}$.

Similarly, a second current generating circuit for developing the negative-going portion of the output pulse comprises a split-path current generator 40, a current spike generator 42, and a pair of current summing nodes 44 and 46. A pair of currents $I_2$ and $I_F$ are applied to the split-path current generator 40, which is switched by the input signal $V_{IN}$ to produce the two parallel output current signals $I_2$ and $I_F$ in synchronization therewith. A small, fixed current $I_b$ is added to the current signal $I_2$ at summing node 44. The current signal $I_F$ is amplified and differentiated by the current spike generator to produce a large current spike at the falling edge of the $I_F$ signal. This current spike, or current surge, is added to the $I_2 + I_b$ signal at the summing node 46, into which current flows via node 12 from the capacitor 20, causing the capacitor to change its state of charge and thereby move the voltage at node 12 in a negative direction. It should be noted that nodes 44 and 46 are algebraic summing nodes, and while the arrows point toward node 12 so as to observe sign convention, current flow is actually in the opposite direction, as exemplified by the current waveforms. The large current spike developed by the current spike generator 42 results in a current surge out of capacitor 20, resulting in a fast falling edge of the output signal $V_{OUT}$ as the voltage at node 12 falls rapidly in a negative direction until the pulse lower voltage level, $-V_{REF}$, is reached. When the new level $-V_{REF}$ is reached, the negative clamping diode 18 turns on and current demanded by summing node 46 now is furnished by the $-V_{REF}$ supply via diode 18 rather than capacitor 20. After the current surge diminishes, the current $I_2 + I_b$ is sufficient to hold the output level voltage level at $-V_{REF}$.

This describes one complete cycle of the pulse generator output signal at terminal 14. As can be appreciated, the various voltages and currents throughout the circuit may be adjusted as desired to permit a wide range of pulse output frequencies, duty cycles, and voltage limits. For example, upper and lower voltage limits may be established by varying $+V_{REF}$ and $-V_{REF}$ by front-panel potentiometer controls. To maintain fast rising and falling edges for higher frequency operation, or with high-voltage output pulses, the currents $I_R$ and $I_F$ may be adjusted to provide just the amount of current surge to effect the desired edges.

A commercial embodiment which has been built and tested is shown in FIG. 2, and as will become apparent, operation thereof is the same as described above in connection with FIG. 1. The split-path current generator 30 of the first, or upper current generating circuit comprises a first emitter-coupled pair of transistors 50 and 52, the common emitters of which are returned to ground through a variable current sink 54, and a second emitter-coupled pair of transistors 56 and 58, the common emitters of which are returned to ground through a current sink 60. The bases of transistors 50 and 52 are connected to a pair of input terminals 62 and 64. The base of transistor 56 is connected to the collector of transistor 50 and to a bias voltage divider network of resistors 66 and 68, while the base of transistor 58 is connected to a suitable bias voltage source.

The current spike generator 32 comprises a common-base amplifier transistor 70, the emitter of which is connected to the collector of transistor 52, and the collector of which is connected to the base of an amplifier transistor 72 and also to a source of positive supply voltage $+V$ through the serial connection of an inductor 74 and a resistor 76. The emitter of transistor 72 is connected to the positive supply voltage through a resistor 78, while the collector thereof is connected to the summing node 36.

The level-holding current $I_1 + I_a$ is produced by a switched current source comprising common-base amplifier transistor 80, the emitter of which is connected to the positive voltage supply via a current-setting resistor 82, and the collector of which is connected to summing node 36. The current node 34 is formed at the emitter of transistor 80, which is also connected to the collector of transistor 58.

The second, or lower current generating circuit is virtually identical to the upper circuit, except that the polarities are reversed, and therefore the reference numerals are the same and each includes a prime symbol.

The output circuit is connected between the summing nodes 36 and 46, and comprises a complementary emitter-follower amplifier 10 consisting of transistors 86 and 88, with the output signal developed at the common emitters and made available at terminal 14. The base of transistor 86 is also connected through the positive clamping diode 16 to a variable source of reference voltage 90, $+V_{REF}$, while the base of transistor 88 is connected through the negative clamping diode 18 to a variable source of reference voltage 92, $-V_{REF}$. A pair of diodes 94 and 96 are connected in series between the bases of transistors 86 and 88.

In operation, assume that the same low-voltage square wave signal $V_{IN}$ discussed in connection with FIG. 1 is applied between the input terminals 62 and 64, and that a cycle is just beginning whereby terminal 62 becomes positive with respect to terminal 64. At this instant, transistors 50', 52, 56, and 58' turn on while transistors 50, 52', 56', and 58 turn off. Transistor 58 had been conducting current $I_1$ away from node 34, and now this current is allowed to conduct through transistor 80 to node 36. With transistor 52 now conducting, collector current $I_R$ cannot come initially from inductor 74 and hence is pulled out of the base of transistor 72, resulting in a large amount of current flowing out of the collector of transistor 72 to the node 36 to be summed with the $I_1 + I_a$ current. With transistor 58' now conducting, current $I_2$ is injected into node 44 so that transistor 80' needs only to provide a small current $I_b$ to provide idle current for diodes 94 and 96, and base drive for output transistor 88. Since transistor 52 collector current $I_R$ is constant, as current begins to flow through inductor 74, increasing at an L/R rate, less current flows through transistor 72, until all of the $I_R$ current is shifted to the inductor and transistor 72 turns off. Thereafter, transistor 80 furnishes the current $I_1 + I_a$ via the summing node 36 to the output follower 86 and diodes 94 and 96. As described earlier in connection with FIG. 1, the large current surge provided by transistor 72 causes the inherent capacitances of diode 16 and transistor 86 to charge rapidly until diode 16 turns on, clamping output terminal 14 at $+V_{REF}$, thereby producing a fast-rising edge with a sharp corner on the leading edge of the output pulse. It can be appreciated that the action described so far may occur in less than a nanosecond.

When the input signal $V_{IN}$ switches states, that is, terminal 62 goes negative with respect to terminal 64, transistors 50, 52', 56', and 58 turn on while transistors 50', 52, 56, and 58' turn off. Transistor 58 conducts current $I_1$ away from node 34, transistor 80' sinks all of the $I_2 + I_b$ current, and transistor 72' turns on, momentarily providing a current surge equal to $\beta I_F$ to cause the voltage at output terminal 14 to fall rapidly to $-V_{REF}$. After all of the current $I_F$ through transistor 70' has been shifted to inductor 74', transistor 72' turns off, and transistor 80' continues to furnish sufficient current to hold the output pulse at the $-V_{REF}$ level. This completes the description of one complete cycle.

As has been pointed out earlier, the input signal $V_{IN}$ may be of any desired repetition rate and duty cycle. Upper and lower levels of the output pulses may be established by adjustment of the variable voltages +V$_{REF}$ and −V$_{REF}$. The circuit will produce voltage pulses having rising and falling edges in the subnanosecond range. The current generators 54 and 54' may be adjusted independently, or may be programmed to provide the required current to the output stage to achieve fast transitions.

While I have shown and described the preferred embodiments of my invention, it will be apparent to those skilled in the art that many changes and modifications may be made without departing from my invention in its broader aspects.

What I claim as being novel is:

1. A pulse generator output stage, comprising:
   means for receiving a voltage square-wave input signal;
   means responsive to said input signal for generating a square-wave current;
   means responsive to said input signal for generating boost currents substantially contemporaneous with the transitions of said input signal;
   means for summing said square-wave current and said boost currents; and
   an output amplifier responsive to said summed currents for generating a pulse voltage output signal,
   wherein said square-wave current generating means comprises a switched current source for developing the positive-going portion of said pulse voltage output signal and a switched current sink for developing the negative-going portion of said output signal.

2. A pulse generator output stage, comprising:
   means for receiving a voltage square-wave input signal;
   means responsive to said input signal for generating a square-wave current;
   means responsive to said input signal for generating boost currents substantially contemporaneous with the transitions of said input signal;
   means for summing said square-wave current and said boost currents; and
   an output amplifier responsive to said summed currents for generating a pulse voltage output signal,
   wherein said boost current generating means includes a first differentiating network connected to a boost current source to produce a positive-going current spike in response to a positive-going transition of said input signal, and a second differentiating network connected to a boost current sink to produce a negative-going current spike in response to a negative-going transition of said input signal.

3. A pulse generator output stage, comprising:
   means for receiving a voltage square-wave input signal;
   means responsive to said input signal for generating a square-wave current;
   means responsive to said input signal for generating boost currents substantially contemporaneous with the transitions of said input signal;
   means for generating a steady state current;
   means for summing said square-wave current, said boost currents, and said steady state current; and
   an output amplifier responsive to said summed currents for generating a pulse voltage output signal.

* * * * *

UNITED STATES PATENT AND TRADEMARK OFFICE
CERTIFICATE OF CORRECTION

PATENT NO. : 4,362,955
DATED : December 7, 1982
INVENTOR(S) : William Harry Davenport It is certified that error appears in the above—identified patent and that said Letters Patent is hereby corrected as shown below:

Column 2, line 55 reads "storage", should read --source--.

Signed and Sealed this

Fifth Day of April 1983

[SEAL]

Attest:

Attesting Officer

GERALD J. MOSSINGHOFF

Commissioner of Patents and Trademarks